(12) United States Patent  (10) Patent No.: US 8,952,751 B2
Thomsen et al.  (45) Date of Patent: Feb. 10, 2015

(54) AMPLIFIER CIRCUITS AND METHODS OF AMPLIFYING AN INPUT SIGNAL

(71) Applicants: Axel Thomsen, Austin, TX (US); Gang Yuan, Austin, TX (US)

(72) Inventors: Axel Thomsen, Austin, TX (US); Gang Yuan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 61 days.

(21) Appl. No.: 13/732,135

(22) Filed: Dec. 31, 2012

(65) Prior Publication Data

US 2014/0184331 A1 Jul. 3, 2014

(51) Int. Cl.
H03F 1/02 (2006.01)
H03F 3/00 (2006.01)
H03F 3/45 (2006.01)

(52) U.S. Cl.
CPC ............ *H03F 3/005* (2013.01); *H03F 3/45197* (2013.01); *H03F 3/45645* (2013.01); *H03F 2203/45404* (2013.01); *H03F 2203/45418* (2013.01); *H03F 2203/45421* (2013.01); *H03F 2203/45424* (2013.01); *H03F 2203/45444* (2013.01); *H03F 2203/45446* (2013.01); *H03F 2203/45528* (2013.01); *H03F 2203/45648* (2013.01)
USPC .............................................. 330/9

(58) Field of Classification Search
USPC ...................................... 330/9; 327/124, 307
See application file for complete search history.

(56) References Cited

U.S. PATENT DOCUMENTS 5,142,238 A * 8/1992 White ................................ 330/9
5,617,093 A * 4/1997 Klein ............................ 341/172
6,140,871 A 10/2000 Taft
6,556,078 B2 4/2003 Buescher et al.
7,276,962 B1 10/2007 Tomasi
7,420,490 B2 9/2008 Gupta et al.
7,880,538 B2 2/2011 Sharma
2007/0001757 A1 1/2007 Josefsson
2008/0024351 A1 1/2008 Gupta et al.
2011/0043270 A1 2/2011 Kusuda

OTHER PUBLICATIONS

Willis, David J.; and Jost, Randy J., "Zero CVF Input Current Switched-Capacitor Instrumentation Amplifier", 48th Midwest Symposium on Circuits and Systems, 2005, Aug. 7-10, 2005, pp. 1255-1258, vol. 2, IEEE, Covington, Kentucky.
Ogawa, Satomi; and Wantanabe, Kenzo, "A Switched-Capacitor Successive-Approximation A/D Converter", IEEE Transactions on Instrumentation and Measurement, vol. 42, No. 4, Aug. 1993, pp. 847-853.
Yilmaz, Abdullah; Wong, Kwok C.; and Chao, Kwong S., "A Switched Capacitor Subranging A/D Conversion Technique", Proceedings of the 35th Midwest Symposium on Circuits and Systems, 1992, vol. 1, pp. 548-551.

\* cited by examiner

*Primary Examiner* — Steven J Mottola
(74) *Attorney, Agent, or Firm* — Cesari & Reed, LLP; R. Michael Reed

(57) ABSTRACT

A method of operating an amplifier circuit having a pre-charge phase and a sample/conversion phase includes, during a pre-charge phase, charging first and second capacitors to first and second bias voltages. The first capacitor is coupled to a first input of an amplifier circuit, which has a second input and an output. The second capacitor is coupled to the second input. During a sample/conversion phase, the first input of the amplifier circuit is coupled to an input signal through the first capacitor to level-shift the input signal according to the first bias voltage and the output of the amplifier is coupled to the second input through the second capacitor to level shift a feedback signal according to the second bias voltage.

20 Claims, 8 Drawing Sheets

AMPLIFIER CIRCUITS AND METHODS OF AMPLIFYING AN INPUT SIGNAL

FIELD

The present disclosure generally relates to amplifier circuits, and more particularly to amplifier circuits that include an AC-coupled input.

BACKGROUND

Often, signal processing circuits include an amplifier, such as a programmable gain amplifier (PGA). Such signal processing circuits may be configured to perform audio signal processing, video signal processing, image processing, and control operations (such as motor control operations), to name a few of many possible applications. Sometimes, a relatively low-power circuit, such as micro-control unit (MCU) or a sensor, may be coupled to a relatively high-power circuit, such as a motor control inverter, a switched mode power supply, or a direct current (DC) to alternating current (AC) inverter for solar conversion. In such cases, a high impedance interface may be used to connect the circuits, allowing for implementation of passive filters, such as protection resistors, breakdown diodes, and the like.

SUMMARY

In an embodiment, a method of operating an amplifier circuit having a pre-charge phase and a sample/conversion phase includes, during a pre-charge phase, charging first and second capacitors to first and second bias voltages. The first capacitor is coupled to a first input of an amplifier circuit, which has a second input and an output. The second capacitor is coupled to the second input. During a sample/conversion phase, the first input of the amplifier circuit is coupled to an input signal through the first capacitor to level-shift the input signal according to the first bias voltage and the output of the amplifier is coupled to the second input through the second capacitor to level shift a feedback signal according to the second bias voltage.

In another embodiment, a circuit includes an amplifier circuit including a first input, a second input, and an output. The circuit further includes a first capacitor configured to be coupled in series between a first input signal and the first input and includes a first feedback capacitor configured to be coupled in series between the output and the second input. The circuit further includes a plurality of switches coupled to the first capacitor and to the first feedback capacitor. The circuit also includes a controller configured to control the plurality of switches to pre-charge the first capacitor and the first feedback capacitor to first and second bias voltages, respectively, during a pre-charge phase. The controller is configured to control the plurality of switches to couple the first input signal to the first input of the amplifier circuit and to couple the output to the second input during a sample phase.

In still another embodiment, a circuit includes an amplifier circuit including having a first input, a second input, a first output, a second output, a first feedback input and a second feedback input. The circuit further includes a first capacitor coupled to the first input, a second capacitor coupled to the second input, a first feedback capacitor coupled to the first feedback input, and a second feedback capacitor coupled to the second feedback input. The circuit also includes a plurality of switches coupled to the first and second capacitors and to the first and second feedback capacitors and a control circuit coupled to the plurality of switches. The control circuit is configured to control the plurality of switches to pre-charge the first and second capacitors to a first bias voltage and the first and second feedback capacitors to a second bias voltage during a pre-charge phase. The control circuit is further configured to control the plurality of switches to couple first and second input signals to the first and second inputs and first and second feedback signals to the first and second feedback inputs, respectively, during a sample phase.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Figure 1:
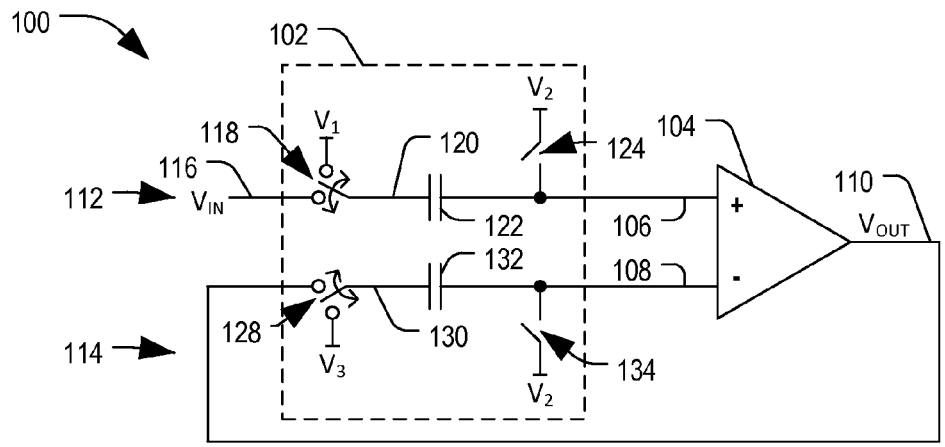
FIG. 1 is a diagram of an amplifier circuit including a single-ended input and an AC-coupling and level-shift circuit according to an embodiment.

In the following detailed description of the embodiments, reference is made to the accompanying drawings which form a part hereof, and in which are shown by way of illustration of specific embodiments. It is to be understood that other embodiments may be utilized and changes may be made without departing from the scope of the present disclosure.

Single supply integrated circuits often cannot process received voltages that exceed the supply voltage by more than a few hundred millivolts. When the received voltage exceeds the supply voltage, the electrostatic discharge (ESD) protection circuitry (such as ESD diodes) may begin to conduct, clamping the voltage. Further, amplifier circuits can run out of headroom and may be unable to process received signals with sufficient fidelity.

Embodiments of a high impedance, low-noise, amplifier are described below that can amplify signals that exceed the supply range of the integrated circuit while still offering high linearity and good noise performance. In an embodiment, a circuit includes an amplifier and an AC-coupling circuit coupled to the amplifier. The circuit includes a single input terminal coupled to the AC-coupling circuit and configured to receive an input signal. The AC-coupling circuit includes a first capacitor including a first terminal coupled to the positive input of the amplifier and a second terminal configured to be selectively coupled to one of the input terminal and a power supply terminal. The AC-coupling circuit further includes a second capacitor including a first terminal coupled to the negative input of the amplifier and a second terminal configured to be selectively coupled to one of an output terminal of the amplifier and the power supply terminal. The AC-coupling circuit further includes a bias switches configured to selectively couple the first terminals of the first and second capacitors to a bias terminal.

In another embodiment, a circuit includes input terminals configured to receive a differential input signal, an amplifier including first and second input terminals and first and second output terminals, and an AC-coupling circuit configured to selectively couple the input terminals to the first and second input terminals of the amplifier. The AC-coupling circuit includes a first capacitor including a first terminal coupled to the first input of the amplifier and a second capacitor including a first terminal coupled to the second input of the amplifier. The AC-coupling circuit further includes switches to selectively couple second terminals of the first and second capacitors to a power supply terminal or the input terminals. The AC-coupling circuit further includes first and second capacitors configured to be selectively coupled to one of a second power supply terminal and the outputs of the amplifier, respectively, on one side and to the first and second amplifier inputs (at summing nodes) on the amplifier side.

Regardless of whether the amplifier configuration is single or double-ended, capacitors at the input can be pre-charged on both sides during a pre-charge phase. In general, the pre-charging of the capacitors introduces noise and an offset that may be amplified by the amplifier. To remove noise introduced during pre-charging, the amplifier either may perform an auto-zero operation to measure and subtract the noise before measuring the input signal (as described below with respect to FIGS. 1-5). In an alternative embodiment (described below with respect to FIG. 6), the AC-coupling circuit may include chop switches that may be selectively opened or closed to invert the input signals to perform a chop operation. In an embodiment, the chop operation may include alternately coupling the positive and negative inputs to the positive and negative amplifier inputs during a first period and coupling the positive and negative inputs to the negative and positive amplifier inputs during a second period. Such a chop operation may also mitigate noise introduced during the pre-charge operation.

In general, amplifiers may be employed in a variety of circuits, including interface circuits, front-end circuitry associated with radio frequency receivers, MCUs, sensor circuits, and the like. One possible implementation of a circuit including an AC-coupled amplifier is described below with respect to FIG. 1.

FIG. 1 is a diagram of an amplifier circuit 100 including a single-ended input and an AC-coupling and level-shift circuit 102 according to an embodiment. Circuit 100 includes an amplifier 104 including a positive input terminal 106, a negative input terminal 108, and an output terminal 110 configured to provide an output signal ($V_{OUT}$). Circuit 100 includes a forward signal path 112 and a feedback signal path 114. Forward signal path 112 includes input terminal 116 coupled to a first terminal of a switch 118, which has a second terminal coupled to a power supply terminal ($V_1$), and a third terminal coupled to a node 120. Forward signal path 112 includes a capacitor 122 including a first terminal coupled to node 120 and a second terminal coupled to positive input terminal 106. Forward signal path 112 further includes a switch 124 including a first terminal coupled to positive input terminal 106 and a second terminal coupled to a second power supply terminal ($V_2$).

Feedback signal path 114 includes a switch 128 including a first terminal coupled to output terminal 110, a second terminal coupled to a third power supply terminal ($V_3$), and a third terminal coupled to a node 130. Feedback signal path 114 further includes a capacitor 132 including a first terminal coupled to node 130 and a second terminal coupled to negative input terminal 108. Feedback signal path 114 also includes a switch 134 including a first terminal coupled to negative input terminal 108 and a second terminal coupled to the second power supply terminal ($V_2$).

In an embodiment, during a pre-charge phase, switches 124 and 134 are closed, switch 118 is coupled to first supply terminal ($V_1$), and switch 128 is coupled to third supply terminal ($V_3$). During this phase, capacitor 122 is pre-charged to a voltage ($V_{C122}$) representing a difference between the voltage on the first supply terminal ($V_1$) and the voltage on the second supply terminal ($V_2$) as follows:

$$V_{C122}=V_1-V_2 \quad (1)$$

During the pre-charge phase, capacitor 132 is pre-charged to a voltage ($V_{C132}$) representing a difference between the voltage on the third supply terminal ($V_3$) and the voltage on the second supply terminal ($V_2$) as follows:

$$V_{C132}=V_1-V_2 \quad (2)$$

During an auto-zero phase, switches 124 and 134 are opened, switch 118 remains coupled to the first supply terminal ($V_1$), and switch 128 is coupled to the output terminal 110 of amplifier 110. During this phase, the output voltage ($V_{OUT}$) represents the voltage ($V_3$) on the output side of capacitor 128 plus offset and noise through amplifier circuit 100 according to the following equation:

$$V_{OUT}=V_2+V_{Error} \quad (3)$$

During the sample/conversion phase, switches 124 and 134 remain open, switch 118 is coupled to input terminal 116, and switch 128 is coupled to output terminal 110. The output voltage can be determined according to the following equation:

$$V_{OUT}=V_2+(V_{IN}-V_1) \quad (4)$$

Thus, amplifier circuit 100 provides signal amplification that is related to the pre-charges applied to capacitors 122 and 132.

The embodiment depicted in FIG. 1 is a relatively simple amplifier configuration. However, it is also possible to implement the pre-charge, auto-zero, and sample/conversion phases with different amplifier configurations. One possible example of a differential amplifier configuration is described below with respect to FIG. 2.

Figure 2:
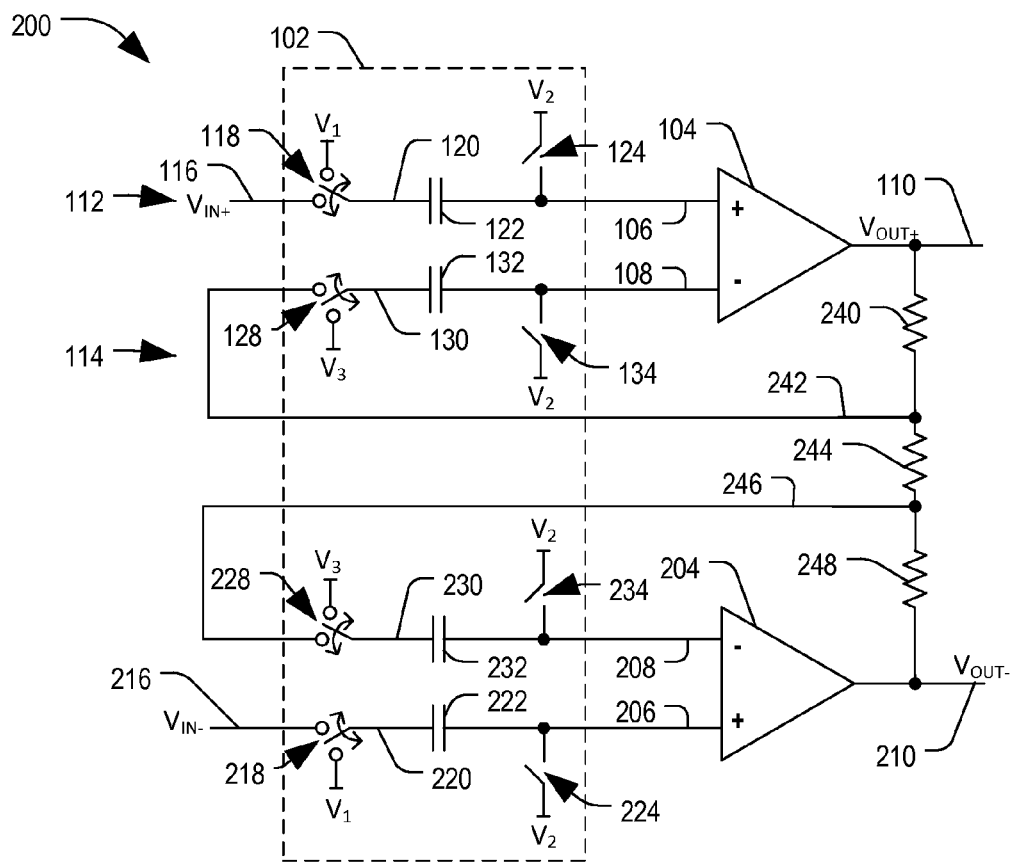
FIG. 2 is a diagram of an amplifier circuit including differential inputs and an AC-coupling and level-shift circuit according to an embodiment.

FIG. 2 is a diagram of an amplifier circuit 200 including differential inputs 116 and 216 and an AC-coupling and level-shift circuit 102 according to an embodiment. Amplifier circuit 200 includes all of the elements of amplifier circuit 100 and includes a resistor 240 coupled between the output terminal 110 and a node 242, which is coupled to the first terminal of switch 128 in the feedback signal path 114.

Amplifier circuit 200 further includes a second amplifier 204 including a positive input terminal 206, a negative input terminal 208, and an output terminal 210. Amplifier circuit 200 also includes a switch 218 including a first terminal coupled to input terminal 216, a second terminal coupled to a supply terminal, such as the first supply terminal ($V_1$), and a third terminal coupled to a node 220. Amplifier circuit 200 also includes a capacitor 222 including a first terminal coupled to node 220 and a second terminal coupled to positive input terminal 206. Amplifier circuit 200 further includes a switch 224 including a first terminal coupled to positive input terminal 206 and a second terminal coupled to a supply terminal, such as second supply terminal ($V_2$).

Amplifier circuit 200 also includes a resistor 248 including a first terminal coupled to output terminal 210 and a second terminal coupled to a node 246. Amplifier circuit 200 also includes a resistor 244 coupled between node 242 and node 246. Amplifier circuit 200 also includes a switch 226 including a first terminal coupled to node 246, a second terminal coupled to a supply terminal, such as third supply terminal ($V_3$), and a third terminal coupled to a node 230. Amplifier circuit 200 further includes a capacitor 232 including a first terminal coupled to node 230 and a second terminal coupled to the negative input terminal of amplifier 204. Amplifier 200 also includes a switch 234 including a first terminal coupled to negative input terminal 208 and a second terminal coupled to a supply terminal, such as second supply terminal ($V_2$).

In a pre-charge phase, switches 124, 134, 224, and 234 are closed, and switches 118, 128, 218, and 228 are coupled to the supply terminals to pre-charge capacitors 122, 132, 222, and 232. During an auto-zero phase switches 118 and 218 remain coupled to the supply terminals, switches 124, 134, 224, and 234 are opened, and switches 128 and 228 are coupled to nodes 242 and 246, respectively. During this phase, the differential output voltage ($V_{OUT+}$ and $V_{OUT-}$) on output terminals 110 and 210 includes the voltages on the node sides (nodes 242 and 246) of capacitors 132 and 232 as well as the offset and noise errors.

During a subsequent sample/conversion phase, switches 124, 134, 224, and 234 remain open, and switches 118 and 218 are coupled to input terminals 116 and 216, respectively. Further, switches 128 and 228 are coupled to nodes 242 and 246, respectively. In this example, the differential output voltage can be determined according to the following equation:

$$V_{OUT+} - V_{OUT-} = \left(\frac{R}{0.5 * R_{244}} + 1\right)(V_{IN+} - V_{IN-}) \quad (5)$$

In Equation 5, the variable (R) represents the resistance of either resistor 240 or resistor 248, which are substantially equal.

Other amplifier configurations are also possible. Another possible example of an amplifier circuit is described below with respect to FIG. 3.

Figure 3:
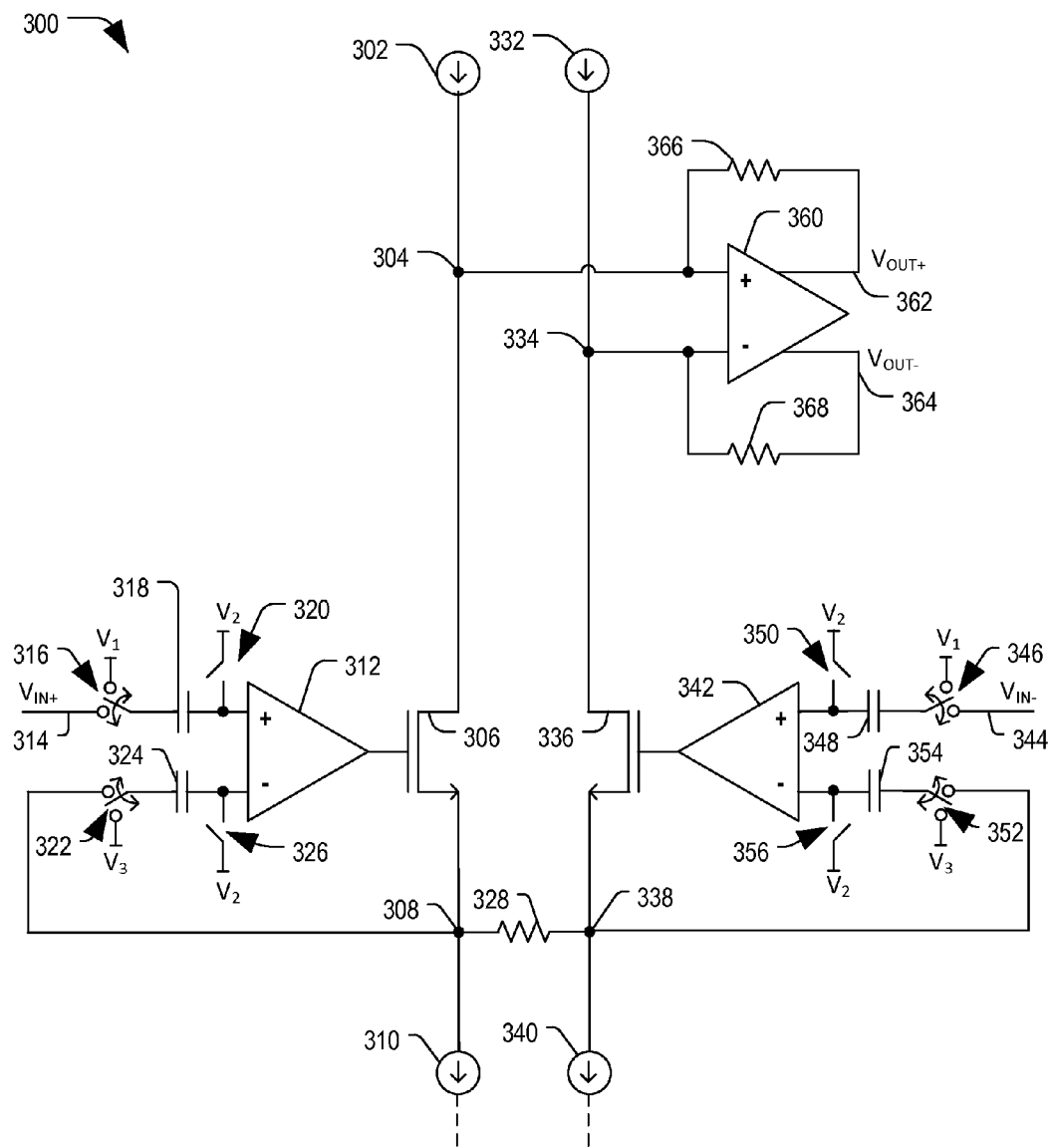
FIG. 3 is a diagram of an amplifier circuit including differential inputs and an AC-coupling and level-shift circuit according to a second embodiment.

FIG. 3 is a diagram of an amplifier circuit 300 including differential inputs 314 and 344 and an AC-coupling and level-shift circuit according to a second embodiment. Amplifier circuit 300 includes a current source 302 coupled to a node 304 and includes a transistor 306 including a first terminal coupled to node 304, a control terminal coupled to an output of an amplifier 312, and a second terminal coupled to a node 308. Node 308 may also be coupled to a current source 310. Amplifier circuit 300 further includes a switch 316 including a first terminal coupled to input terminal 314, a second terminal coupled to a power supply terminal ($V_1$), and a third terminal coupled to a first terminal of a capacitor 318. Capacitor 318 includes a second terminal coupled to a positive input terminal of amplifier 312. Amplifier circuit 300 further includes a switch 322 including a first terminal coupled to node 308, a second terminal coupled to a power supply terminal (such as supply terminal $V_3$), and a third terminal coupled to a first terminal of a capacitor 324. Capacitor 324 includes a second terminal coupled to a negative input terminal of amplifier 312. Amplifier circuit 300 further includes a switch 320 including a first terminal coupled to a power supply terminal ($V_2$) and a second terminal coupled to the positive input terminal of amplifier 312. Amplifier circuit 300 also includes a switch 326 including a first terminal coupled to a power supply terminal ($V_2$) and a second terminal coupled to the negative input terminal of amplifier 312.

Amplifier circuit 300 further includes a current source 332 coupled to a node 334 and includes a transistor 336 including a first terminal coupled to node 334, a control terminal coupled to an output of an amplifier 342, and a second terminal coupled to a node 338. Node 338 may also be coupled to a current source 340. Amplifier circuit 300 further includes a switch 346 including a first terminal coupled to input terminal 344, a second terminal coupled to a power supply terminal ($V_1$), and a third terminal coupled to a first terminal of a capacitor 348. Capacitor 348 includes a second terminal coupled to a positive input terminal of amplifier 342. Amplifier circuit 300 further includes a switch 352 including a first terminal coupled to node 338, a second terminal coupled to a power supply terminal (such as supply terminal $V_3$), and a third terminal coupled to a first terminal of a capacitor 354. Capacitor 3254 includes a second terminal coupled to a negative input terminal of amplifier 342. Amplifier circuit 300 further includes a switch 350 including a first terminal coupled to a power supply terminal ($V_2$) and a second terminal coupled to the positive input terminal of amplifier 342. Amplifier circuit 300 also includes a switch 356 including a first terminal coupled to a power supply terminal ($V_2$) and a second terminal coupled to the negative input terminal of amplifier 342.

Amplifier circuit 300 further includes an amplifier 360 including a positive input terminal coupled to node 304, a negative input terminal coupled to node 334, a positive output terminal 362 to provide a positive output voltage ($V_{OUT+}$), and a negative output terminal 364 to provide a negative output voltage ($V_{OUT-}$). Amplifier circuit 300 further includes a resistor 366 including a first terminal coupled to positive output terminal 362 and a second terminal coupled to node 304. Amplifier circuit 300 also includes a resistor 368 including a first terminal coupled to negative output terminal 364 and a second terminal coupled to node 334.

In the illustrated embodiment, during a pre-charge phase, switches 320, 322, 346, and 352 are coupled to the supply terminals, and switches 320, 326, 350, and 356 are closed. During the pre-charge phase, capacitors 318, 324, 348, and 354 are charged to selected level. During an auto-zero phase, switches 320, 326, 350, and 356 are opened, switches 318 and 346 remain coupled to the supply terminal, and switches 322 and 352 are coupled to nodes 308 and 338, respectively. The output voltages ($V_{OUT+}$ and $V_{OUT-}$) includes at least a portion of the pre-charge stored on capacitors 324 and 354 as well as the voltage error due to offsets and noise. During the sample/conversion phase, switches 316 and 346 are coupled to input terminals 314 and 344 and the resulting differential output voltage can be determined as follows:

$$(V_{OUT+} - V_{OUT-}) = \frac{R_{366} + R_{368}}{R_{328}}(V_{IN+} - V_{IN-}) \quad (6)$$

In the embodiment of FIG. 3, the offset and noise determined during the auto-zero phase can be used to cancel to reduce or cancel the offset and noise in the amplified version of the input signal to produce an output signal proportional to the input signal.

The auto-zero operation using the capacitive coupling circuitry can be implemented with a variety of amplifier architectures. Another amplifier architecture implemented using switched capacitors is described below with respect to FIG. 4.

Figure 4:
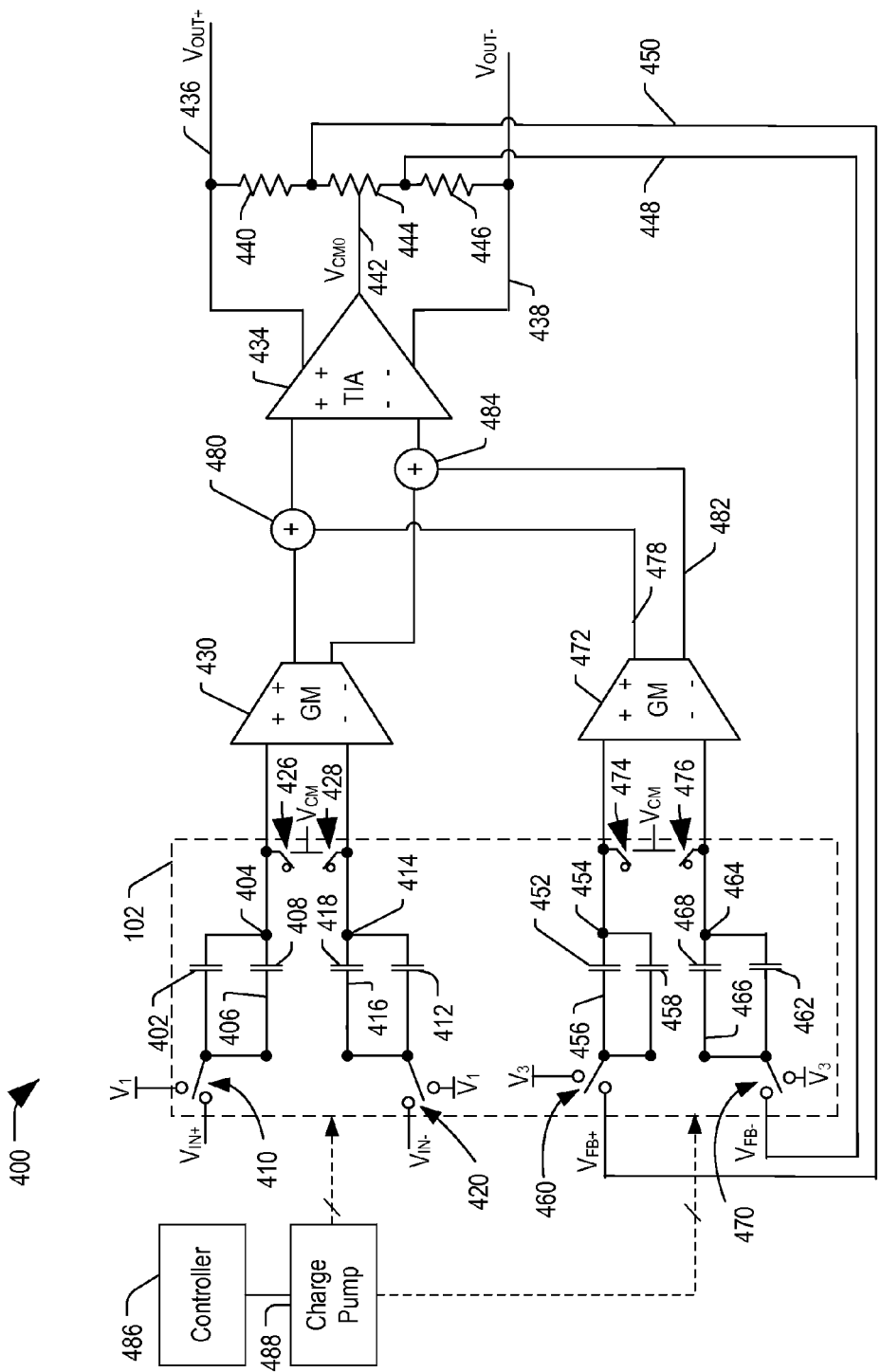
FIG. 4 is a diagram of an amplifier circuit including differential inputs and an AC-coupling and level-shift circuit according to a third embodiment.

FIG. 4 is a diagram of an amplifier circuit 400 including different inputs ($V_{IN+}$ and $V_{IN-}$) and AC-coupling and level-shift circuitry 102 according to a third embodiment. Amplifier circuit 400 includes a switch including a first terminal coupled to the positive input terminal ($V_{IN+}$), a second terminal coupled to a supply terminal ($V_1$), and a third terminal coupled to a node 406. Amplifier circuit 400 further includes a capacitor 402 including a first terminal coupled to node 406 and a second terminal coupled to a node 404. Amplifier circuit 400 further includes a capacitor 408 including a first terminal coupled to node 406 and a second terminal coupled to node 404, which is coupled to a positive input terminal of an amplifier 430. Amplifier 430 may be implemented as a transconductance amplifier. Amplifier circuit 400 further includes a switch 420 including a first terminal coupled to negative input terminal ($V_{IN-}$), a second terminal coupled to the power supply terminal ($V_1$), and a third terminal coupled to a node 416. Amplifier circuit 400 includes a capacitor 418 including a first terminal coupled to node 416 and a second terminal coupled to a node 418, which is coupled to a negative input terminal of amplifier 430. Amplifier circuit 400 further includes switches 426 and 428. Switch 426 includes a first terminal coupled to the positive input terminal of amplifier 430 and a second terminal coupled to a bias terminal ($V_{CM}$). Switch 428 includes a first terminal coupled to the negative input terminal of amplifier 430 and a second terminal coupled to a bias terminal ($V_{CM}$).

Amplifier 430 includes a positive output terminal coupled to a first input of a first summing node 480, which has a second input, and an output coupled to a positive input of an amplifier 434. Amplifier 430 includes a negative output terminal coupled to a first input of a second summing node 484, which has a second input, and an output coupled to a negative input of amplifier 434. Amplifier 434 may be implemented as a transimpedance amplifier (TIA). Amplifier 434 includes a positive output terminal 436 configured to provide a positive output voltage ($V_{OUT+}$), a negative output terminal 438 configured to provide a negative output voltage ($V_{OUT-}$), and a common mode output terminal 442 configured to provide a common mode voltage ($V_{CMO}$). Amplifier circuit 400 includes a resistor 440 including a first terminal coupled to positive output terminal 436 and a second terminal coupled to a node 450. Amplifier circuit 400 further includes a resistor 444 including a first terminal coupled to node 450, a center tap coupled to the common mode output terminal 442, and a second terminal coupled to a node 448. Amplifier circuit 400 also includes a resistor 446 including a first terminal coupled to node 448 and a second terminal coupled to negative output terminal 438. Nodes 450 and 448 are configured to provide positive and negative feedback voltages ($V_{FB+}$ and $V_{FB-}$), respectively.

Amplifier circuit 400 further includes a feedback switch 460 including a first terminal coupled to node 450, a second terminal coupled to a supply terminal ($V_3$), and a third terminal coupled to a node 456. Amplifier circuit 400 includes a capacitor 452 including a first terminal coupled to node 456 and a second terminal coupled to a node 454, which is coupled to a positive input terminal of an amplifier 472. Amplifier 472 may be implemented as a transconductance amplifier. Amplifier circuit 400 further includes a capacitor 458 including a first terminal coupled to node 456 and a second terminal coupled to node 454. Amplifier circuit 400 further includes a feedback switch 470 including a first terminal coupled to node 448, a second terminal coupled to a supply terminal ($V_3$), and a third terminal coupled to a node 466. A capacitor 462 includes a first terminal coupled to node 466 and a second terminal coupled to a node 464, which is coupled to a negative input terminal of amplifier 472. A capacitor 468 includes a first terminal coupled to node 466 and a second terminal coupled to node 464. A switch 474 includes a first terminal coupled to node 454 and a second terminal coupled to a bias terminal ($V_{CM}$), and a switch 476 includes a first terminal coupled to node 464 and a second terminal coupled to the bias terminal ($V_{CM}$). Amplifier 472 includes a positive output terminal 478 coupled to summing node 480 and a negative output terminal 782 coupled to summing node 484.

Amplifier circuit 400 also includes a controller 486 coupled to an input of a charge pump 488, which has outputs coupled to AC-coupling and level-shift circuit 102. Controller 486 is configured to control charge pump 488 to selectively bias switches 410, 420, 426, 428, 460, 470, 474, and 476 during a pre-charge phase, an auto-zero phase, and a sample/conversion phase.

In an embodiment, the input voltage potential ($V_{IN}$) received at input terminals $V_{IN+}$ and $V_{IN-}$ may be isolated from AC-coupling capacitors of AC-coupling and level-shift circuit 102 by switches 410 and 420 during a pre-charge operation. In particular, during a pre-charge phase, switches 410 and 420 may be coupled to supply terminals ($V_1$), switches 460 and 470 may be coupled to supply terminals ($V_3$), and switches 426, 428, 474, and 476 may be closed to couple nodes 404, 414, 454, and 464 to a selected bias voltage.

During an auto-zero phase, switches 410 and 420 may remain coupled to supply terminals ($V_1$), switches 426, 428, 474, and 476 are opened, and switches 460 and 470 are coupled to feedback nodes 450 and 448, respectively. During this phase, the output voltages ($V_{OUT+}$ and $V_{OUT-}$) on output terminals 436 and 438 settle to voltage levels that represent a voltage error ($V_{Error}$) that includes an offset error and noise.

During a sample/conversion phase, switches 410 and 420 are coupled to positive and negative input terminals ($V_{IN+}$ and $V_{IN-}$), respectively, to sample the input signal onto capacitors 402, 408, 412, and 418. The output voltage ($V_{OUT+}-V_{OUT-}$) is proportional to the input voltages according to the following equation:

$$(V_{OUT+} - V_{OUT-}) = \left(1 + \frac{R_2}{R_1}\right)(V_{IN+} - V_{IN-}) \qquad (7)$$

In Equation 7, the resistance ($R_2$) represents the resistance of resistor 440 or resistor 446, which are substantially matched. Additionally, the resistance ($R_1$) represents approximately one-half of the resistance of resistor 444. The auto-zero operation determines the output voltage error, which is then subtracted from the differential input voltage at summing nodes 480 and 484, allowing amplifier circuit 400 to produce the differential output voltage with reduced voltage error.

In an example, amplifier circuit 400 may be positioned between a circuit and one or more sensors or may be included as an intermediate circuit between a low power circuit (such as a micro control unit (MCU) or an amplifier) and relatively high power circuitry, such as a motor control inverter, a switched-mode power supply, a DC-to-AC inverter, or other relatively high power circuits. Amplifier circuit 400 allows for the implementation of passive filters, protection resistors, and the like. Further, amplifier circuit 400 presents a high impedance, low noise, programmable gain amplifier that can amplify signals that exceed the supply range of an integrated circuit, while still offering high linearity and good noise performance.

In the illustrated embodiment of FIG. 4, the input capacitors 402, 408, 412, and 418 may be pre-charged to a voltage level according to the following equation:

$$V_{IN_{CAP}} = V_{IN+or-} - V_{CM} \quad (8)$$

where the voltage stored on the input capacitors is the common mode of the input voltages minus the bias voltage ($V_{CM}$), which may be a mid-supply voltage. The feedback capacitors 452, 458, 462, and 468 may be pre-charged to a voltage level according to the following equation:

$$V_{FB_{CAP}} = V_{OUT+or-} - V_{CM} \quad (9)$$

The output current ($I_{OUT1}$) at the positive output of amplifier 306 may be determined according to the following equation:

$$I_{OUT1} = G_{M430}(V_{IN}^+ - V_{IN}^-) \quad (10)$$

where the variable ($G_M$) refers to the gain of amplifier 430.

In the example of FIG. 4, a gain feedback loop may be provided; however, it is also possible to provide a separate feedback loop for the offset voltage. One possible example of an implementation of amplifier circuit 400 including an offset feedback loop is described below with respect to FIG. 5.

Figure 5:
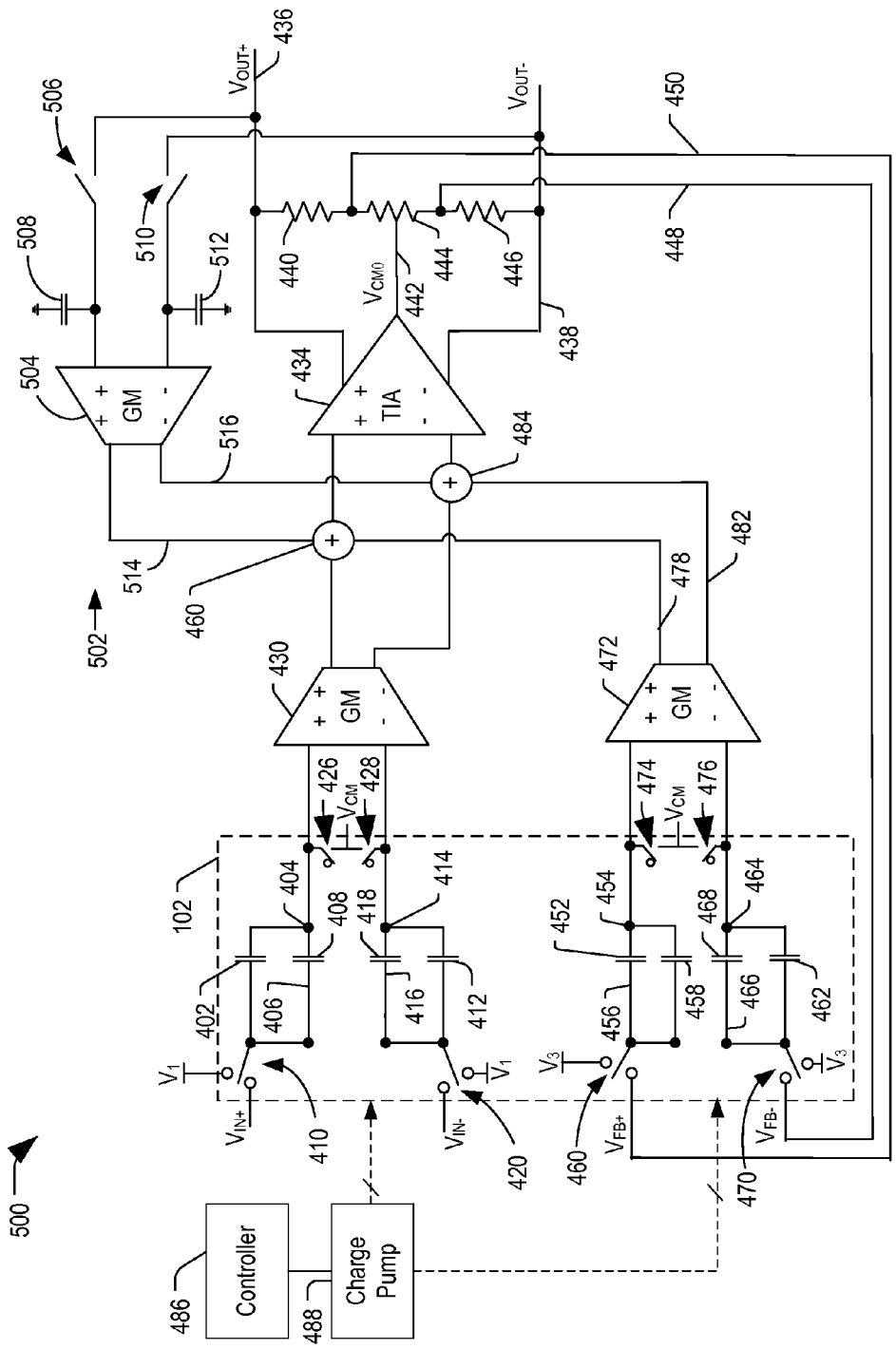
FIG. 5 is a diagram of an amplifier circuit including differential inputs and an AC-coupling and level-shift circuit according to a third embodiment including an offset feedback path.

FIG. 5 is a diagram of amplifier circuit 500, which may be second embodiment of amplifier 400 in FIG. 4. Amplifier circuit 500 includes all of the elements of amplifier circuit 400 and further includes an offset feedback loop 502. Offset feedback loop 502 includes an amplifier 504 including a first input coupled to positive output terminal 436 through a switch 506. A capacitor 508 includes a first terminal coupled to the first input of amplifier 504 and includes a second terminal coupled to a power supply terminal (such as ground). Amplifier 504 further includes a second input coupled to output terminal 438 through a switch 510. A capacitor 512 includes a first terminal coupled to the second input of amplifier 504 and includes a second terminal coupled to a power supply terminal (such as ground). Amplifier 504 includes a positive output coupled to a third input of summing node 480 by line 514 and includes a negative output coupled to a third input of summing node 484 by line 516.

In an embodiment, summing node 480 subtracts the feedback current from feedback terminal 478 and offset current from amplifier 504 via line 514 from the amplified output on the positive output terminal of amplifier 430 to produce a difference that may be provided to the positive input of amplifier 434. Summing node 484 subtracts the feedback current from feedback terminal 482 and offset current from negative output of amplifier 504 from line 516 from the output current of the negative output terminal of amplifier 430 to produce a difference that may be provided to the negative input of amplifier 434.

In an embodiment, switches 506 and 510 can be closed during an auto-zero phase to sample the offset voltage onto capacitors 508 and 512. Switches 506 and 510 can then be opened and the charge on capacitors 508 and 512 may be applied to the inputs of amplifier 504. In an embodiment, amplifier 504 may be a transconductance amplifier configured to convert the charge on capacitors 508 and 512 into a current provided to summing nodes 480 and 484.

In this example, during the pre-charge phase, switches 506 and 510 would be kept open while the capacitors 402, 408, 412, 418, 452, 458, 462, and 468 are pre-charged. After the pre-charge phase, during the auto-zero phase, switches 410 and 420 are coupled to supply terminals ($V_1$), switches 460 and 470 are coupled to feedback nodes 450 and 448, respectively, and switches 426, 428, 474, and 476 are opened. Further, switches 506 and 510 are closed to sample the voltage error ($V_{Error}$), including the offset voltage and noise, onto capacitors 508 and 512. During a sample/conversion phase, switches 506 and 510 are opened, and switches 410 and 420 are coupled to input terminals ($V_{IN+}$ and $V_{IN-}$).

In the above-discussion, AC-coupling and level-shift circuitry 102 has been depicted with switches that could be controlled to implement an auto-zero function. However, it is also possible to construct the AC-coupling and level-shift circuit 102 with additional switches in order to implement a chop operation to reduce or eliminate the voltage error. In general, if a chop operation is used, the auto-zero operation may be omitted. One possible example of such a circuit and its operation are described below with respect to FIG. 6.

Figure 6:
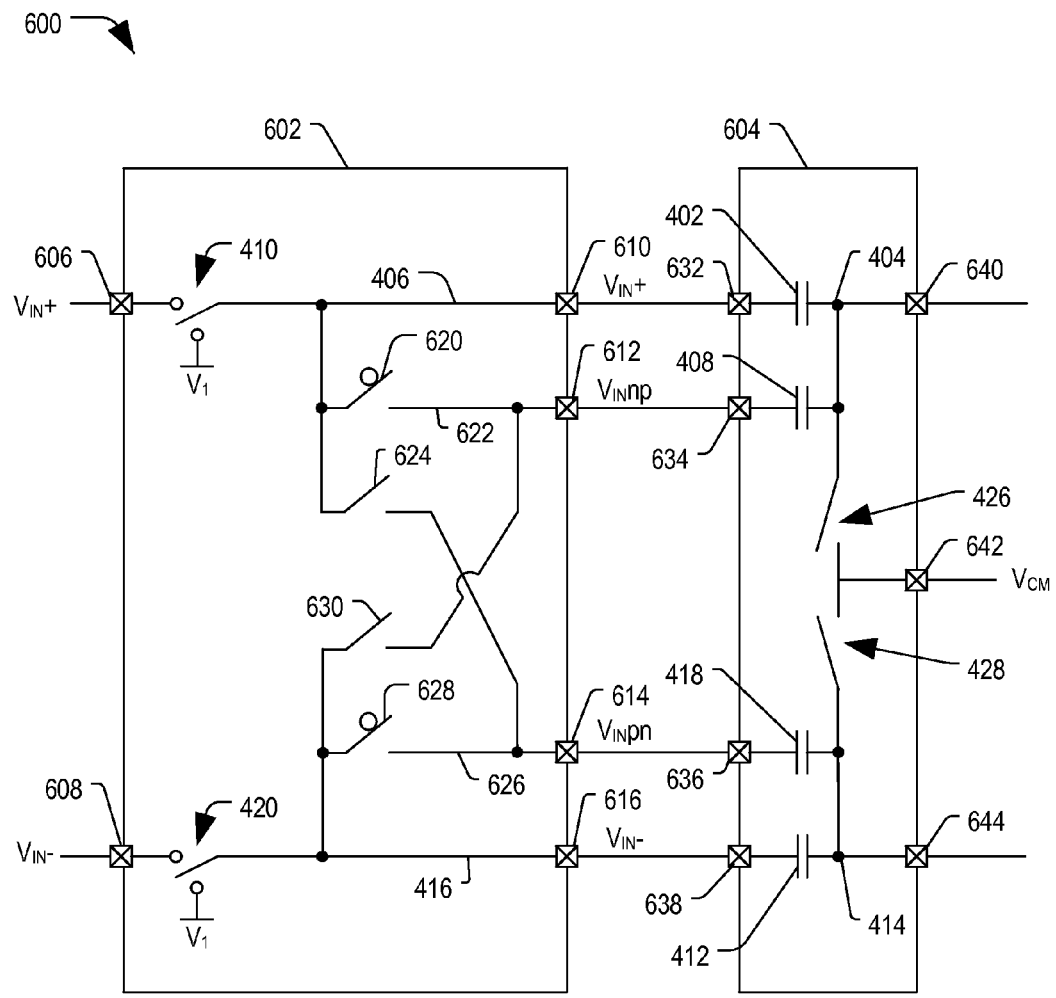
FIG. 6 is a partial schematic diagram of a circuit including a switching circuit and a capacitive coupling circuit of FIGS. 1-5 according to an embodiment.

FIG. 6 is a partial schematic diagram of a circuit 600 including a switching circuit 602 and a capacitive-coupling circuit 604, which cooperate to form an embodiment of the AC-coupling and level-shift circuitry of FIGS. 1-5. Switching circuit 602 includes terminals or pads 606 and 608 configured to couple to input terminals ($V_{IN+}$ and $V_{IN-}$). Switching circuit 602 further includes terminals or pads 610, 612, 616, 618, and 620 configured to couple to terminals or pads of capacitive-coupling circuit 604.

Switching circuit 602 includes switch 410 configured to couple node 406 to one of the supply voltage ($V_1$) and the positive input terminal ($V_{IN+}$) through pad 606. Node 406 is coupled to pad 610, which is coupled to pad 632 of capacitive coupling circuit 604. Switching circuit 602 further includes a switch 620 including a first terminal coupled to node 406 and a second terminal coupled to a node 622. Node 622 is coupled to pad 612, which is coupled to pad 634 of capacitive coupling circuit 604. Switching circuit 602 further includes switch 420 configured to couple node 416 to one of the supply voltage ($V_1$) and the negative input terminal ($V_{IN-}$) through pad 608. Node 416 is coupled to pad 626, which is coupled to pad 638 of capacitive coupling circuit 604. Switching circuit 602 further includes a switch 628 including a first terminal coupled to node 416 and a second terminal coupled to a node 626. Node 626 is coupled to pad 614, which is coupled to pad 626 of capacitive coupling circuit 604.

Switching circuit 602 further includes a chop switch 624 including a first terminal coupled to node 406 and a second terminal coupled to node 626. Switching circuit 602 also includes a chop switch 630 including a first terminal coupled to node 416 and a second terminal coupled to node 622.

Capacitive coupling circuit 602 includes capacitor 402 including a first terminal coupled to pad 632 and a second terminal coupled to node 404, which is coupled to pad 640. Capacitive coupling circuit 602 includes capacitor 408 including a first terminal coupled to pad 634 and a second terminal coupled to node 404. Capacitive coupling circuit 602 includes switch 426 including a first terminal coupled to node 404 and a second terminal coupled to a bias terminal ($V_{CM}$), which may be configured to provide a common mode voltage. Capacitive coupling circuit 602 includes capacitor 412 including a first terminal coupled to pad 638 and a second terminal coupled to node 414, which is coupled to pad 640. Capacitive coupling circuit 602 includes capacitor 418 including a first terminal coupled to pad 636 and a second terminal coupled to node 414. Capacitive coupling circuit 602 includes switch 428 including a first terminal coupled to node 414 and a second terminal coupled to a bias terminal ($V_{CM}$).

Switches 410, 420, 426, 428, 620, 624, 628, and 630 may be controlled to selectively provide a pre-charge phase, an auto-zero phase, and a sample/conversion phase, as described above with respect to FIGS. 1-5. In such a case, chop switches 624 and 630 remain open through all three phases.

In a chop mode, the pre-charge operation is performed as described above with respect to FIGS. 1-5 (with the chop switches 624 and 630 open). After the pre-charge phase, instead of performing an auto-zero operation, a chop operation may be used to reduce the voltage error due to offset and noise. In this example, chop switches 624 and 630 may be controlled be open during a first phase and closed during a second phase, which switches 620 and 628 are closed during the first phase and open during the second phase, chopping one way during the first phase and the other way during the second phase.

Thus, AC-coupling and level shift circuit 600 may be used to implement an amplifier circuit that can utilize a pre-charge operation to level shift a signal and that utilize either an auto-zero operation or a chop operation to reduce or eliminate output voltage errors due to offset errors and noise. In general, switching on the input side of the AC coupling capacitors 402, 408, 412, and 418 can be complicated by the fact that the differential input voltage may vary significantly. In some instances, the input voltage may fall to levels as low as 700 mV below ground. However, the charge pump 488 in FIGS. 4 and 5 may be integrated on the same chip as the amplifier to provide the gate and bulk voltages for the auto-zero and chopping switches.

Figure 7:
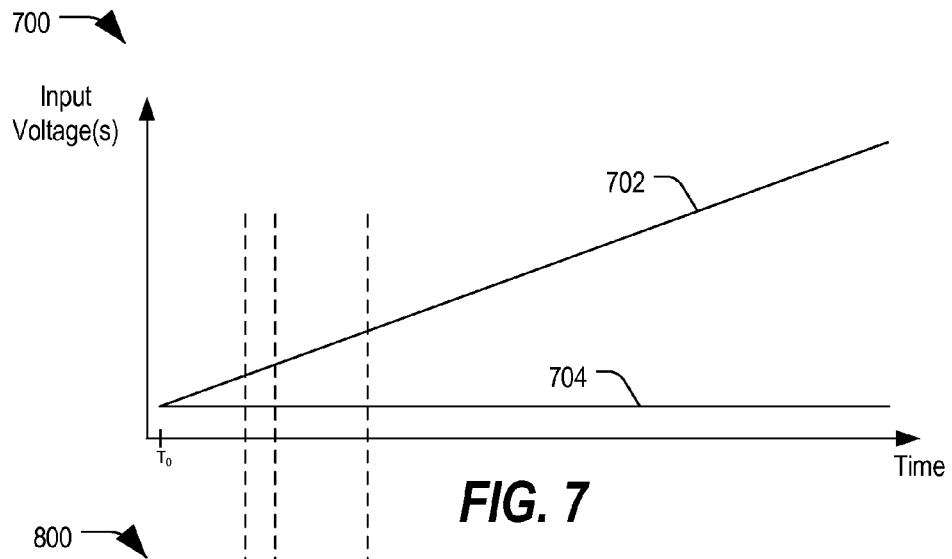
FIGS. 7-9 are illustrative examples of timing diagrams depicting a changing input voltage, auto-zero and pre-charge timing signals, and resulting output voltage signals for embodiments of the amplifiers of FIGS. 1-6.
Figure 8:
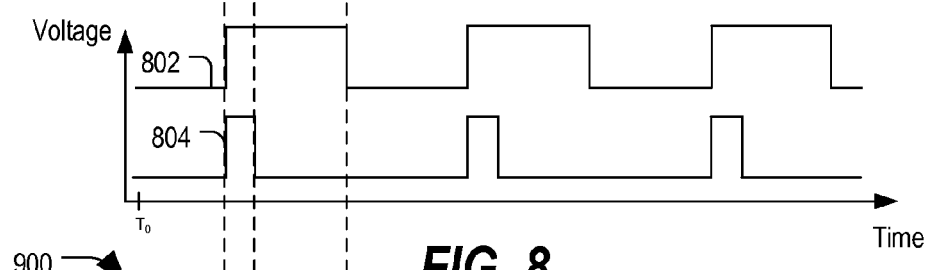
Figure 9:
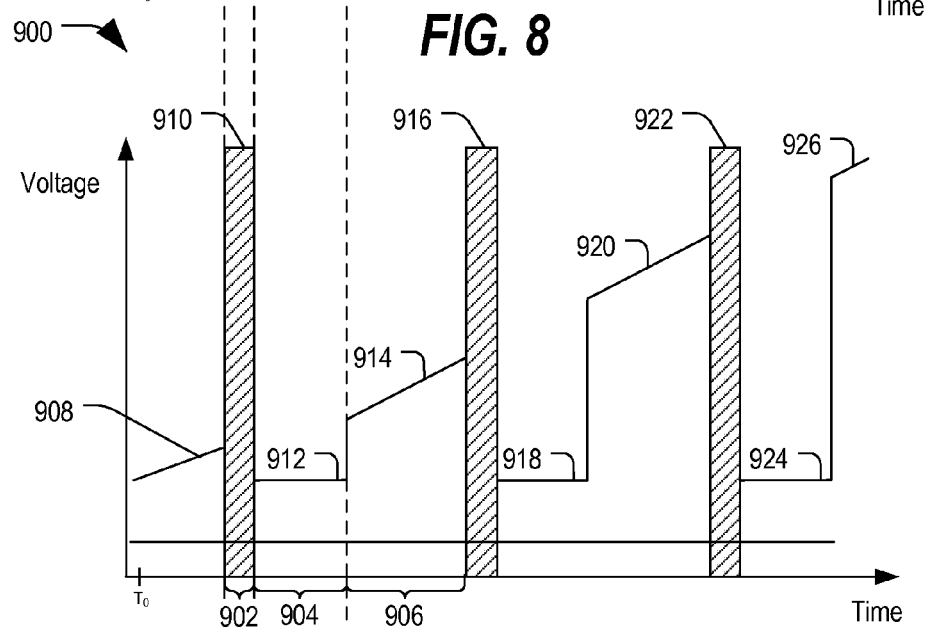

FIGS. 7-9 are illustrative examples of timing diagrams 700, 800, and 900 depicting a changing input voltage, auto-zero and pre-charge timing signals, and resulting output voltage signals for the amplifier circuits 100, 300, 400, and 500 of FIGS. 1-5.

FIG. 7 is a diagram 700 depicting an illustrative example of a changing input voltage potential over time at input terminals 104 and 106. Diagram 700 includes a first voltage 702 on input terminal 104 and a second voltage 704 on input terminal 106. In this illustrative example, the voltage potential between first and second voltages 702 and 704 increases over time.

FIG. 8 is a diagram 800 depicting an illustrative example of relative timing of the auto-zero, pre-charge, and sampling phases of AC-coupling and level-shift circuit 102 in FIGS. 1-5. Diagram 800 includes a pre-charge signal 804 that transitions from a logic-low level to a logic-high level, holds at the logic-high level for a relatively brief period of time, and then returns to a logic-low level. When pre-charge signal 804 is at a logic-high level, switches 426 and 428 are closed to couple nodes 404 and 414 to a voltage level corresponding to the bias voltage ($V_{CM}$) on pad 642, pre-charging the amplifier side of capacitors 402, 408, 412, and 418 during a pre-charge phase. Diagram 800 may further include an auto-zero signal 802 that transitions from a logic-low level to a logic-high level substantially concurrently with the low-to-high transition of the pre-charge signal 804. When pre-charge signal 804 transitions from high to low, auto-zero signal 802 remains at a logic-high level for an auto-zero phase during which the offset may be determined.

After the auto-zero period, during a third (sampling) phase, auto-zero signal 802 transitions from a logic-high level to a logic-low level, allowing the input signal to be coupled to capacitors 402, 408, 412, and 418 to deliver an AC-portion of the input signal at input terminals 104 and 106 to amplifier 306. The pre-charge, auto-zero, and sampling phases may be repeated periodically or as needed based on the noise or the loss of charge from the pre-charged and/or offset capacitors.

FIG. 9 is a diagram 900 depicting an illustrative example of the output voltage at output terminals 312 and 314 of amplifier 100 during the pre-charge phase 902, the auto-zero phase 904, and the sampling phase 906. Diagram 900 includes an output voltage signal 908 during a first sampling phase. Diagram 900 further depicts a pre-charge phase 902 corresponding to the duration of pre-charge signal 804 in FIG. 8, during which time the output signal is not measured as indicated at 910 and is not measured during subsequent pre-charge phases as indicated at 916 and 922. In one embodiment, the output value during pre-charge is not measured. In another embodiment, the output value is ignored during the pre-charge phase.

After the pre-charge phase 902, during the auto-zero phase 904, the offset voltage 912 may be determined at the output. The auto-zero phase 904 corresponds to auto-zero signal 802 in FIG. 8. After the auto-zero phase 904, the input voltage may be coupled to coupling capacitors 402, 408, 412, and 412 and the output voltage reflects an amplified version of the input voltage as indicated at 914. During subsequent iterations, the offset voltages are determined at 918 and 924, and the output voltages are determined at 920 and 926. Output voltages 908, 914, 920, and 926 may represent amplified versions of the input signal.

Figure 10:
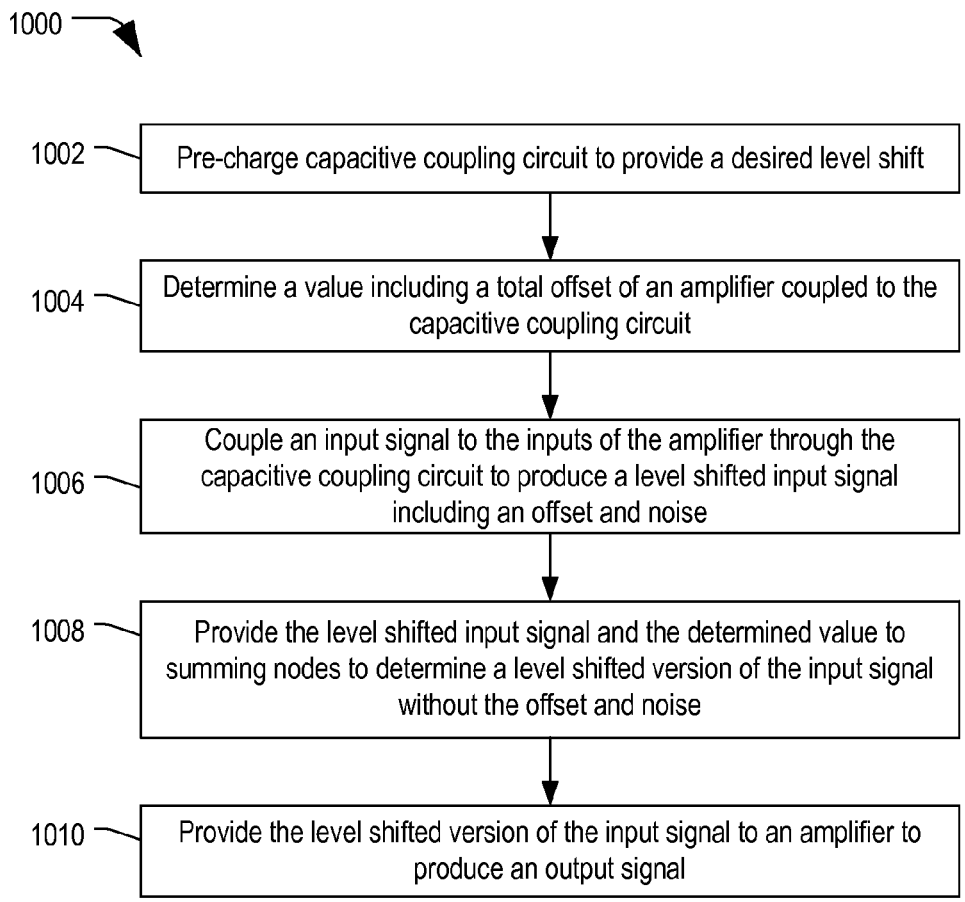
FIG. 10 is a flow diagram of a method of providing an amplified output signal according to an embodiment.

FIG. 10 is a flow diagram of a method 1000 of providing an amplified output signal according to an embodiment. At 1002, a capacitive coupling circuit is pre-charged. As discussed above, controller 486 controls charge pump 488 to selectively bias switches 410 and 420 to couple the input terminal side of capacitors 402, 408, 412, and 418 to a first voltage terminal, which may be configured to provide a common mode input voltage. Controller 486 may also control charge pump 488 to selectively bias switches 426, 428, 474, and 476 to couple the amplifier side of capacitors 402, 408, 412, and 418 to a selected bias voltage. Further, within a feedback path, controller 486 may control charge pump 488 to bias switches 460 and 470 to couple the feedback side of capacitors 452, 458, 462, and 468 to a second voltage level. Controller 486 may also control charge pump 488 to bias switches 474 and 476 to couple the amplifier side of capacitors 452, 458, 462, and 468 to the selected bias voltage.

Advancing to 1004, a value including a total offset of an amplifier coupled to capacitive coupling circuit is determined. The total offset may include noise due to the pre-charge operation. As discussed above, switches 426, 428, 474, and 476 are opened, and switches 460 and 470 are coupled to feedback nodes 450 and 448, respectively. The output of the amplifier may be allowed to settle at an offset voltage level representing the offset voltage plus flicker noise (Voltage error).

Continuing to 1006, an input signal is coupled to the inputs of the amplifier through the capacitive coupling circuit to produce a level-shifted input signal including an offset and noise. As discussed above, controller 486 controls charge pump 488 to selectively close one or more of switches 410 and 420 to couple the input signal at input terminals $V_{IN+}$ and $V_{IN-}$ to terminals of AC-coupling and level shift capacitors. Moving to 1008, the level-shifted input signal and the determined value are provided to summing nodes to determine a level-shifted version of the input signal without the offset and noise. In an embodiment, the difference may be determined using summing nodes 480 and 484 to recover the amplified input signal (amplified by transconductance amplifier 430) by subtracting the determined value from the level-shifted version of the input signal. Proceeding to 1010, the level-shifted version of the input signal is provided to an amplifier to produce an output signal.

In the above example, auto-zero and pre-charge are used to calibrate the amplifier circuit. The bias voltage used to pre-charge the input capacitors may partially determine the amount of level-shifting. As discussed above, the auto-zero operation can be used to remove flicker noise associated with the pre-charge operation and to remove offset noise associated with the circuit. As previously discussed with respect to the auto-zero phase of the various amplifier architectures, method 1000 can be employed with a variety of different amplifier implementations. In an alternative example, such as with a single input amplifier (FIG. 1), method 400 may omit blocks 1008 and 1010. Further, while method 1000 refers to an auto-zero type of technique, other techniques may be applied to reduce or eliminate the output voltage error due to offsets and noise. One technique for removing or reducing the offset and flicker noise uses a chopping function. One possible example of a method of level-shifting an input signal and of using a chopping function to remove noise is described below with respect to FIG. 11.

Figure 11:
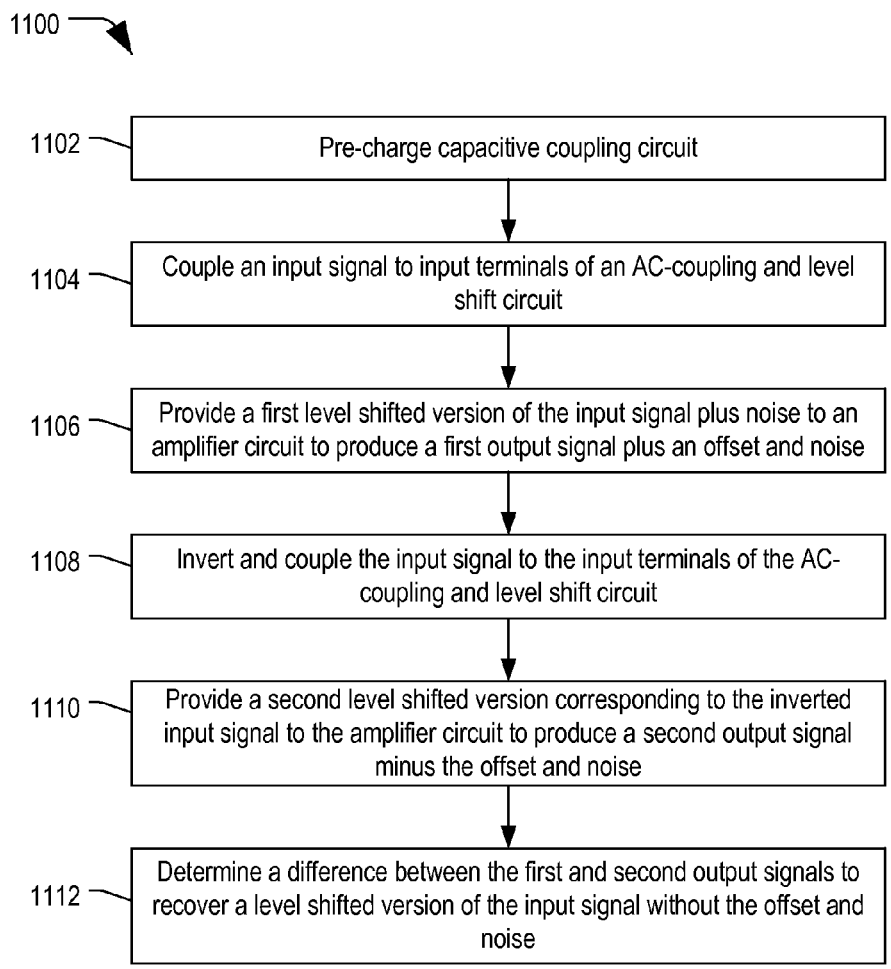
FIG. 11 is a flow diagram of a method of providing an amplified output signal according to a second embodiment.

FIG. 11 is a flow diagram of a method 1100 of providing an amplified output signal according to a second embodiment. At 1102, a capacitive coupling circuit is pre-charged during a pre-charge phase. Advancing to 1104, an input signal is coupled to input terminals of an AC-coupling and level-shift circuit. In an embodiment, switches 410 and 420 are closed to couple input terminals ($V_{IN+}$ and $V_{IN-}$) to capacitors 402, 408, 412, and 418. Continuing to 1106, a first level-shifted version of the input signal plus noise is provided to an amplifier circuit to produce a first output signal plus an offset and noise.

Moving to 1108, the input signal is inverted and coupled to the input terminals of the AC-coupling and level-shift circuit. In an embodiment, switch 624 is closed to couple input terminal ($V_{IN+}$) to node 626, and switch 630 is closed to couple input terminal ($V_{IN-}$) to node 622. Advancing to 1010, a second level-shifted version corresponding to the inverted input signal to the amplifier circuit is provided to the amplifier circuit to produce a second output signal minus the offset and noise. Continuing to 1012, a difference is determined between the first and second output signals to recover a level-shifted version of the input signal with a reduced output voltage error. In an embodiment, the difference is determined via summing nodes 480 and 484 based on the stored offset voltage from amplifier 504 and from the feedback voltage from amplifier 472.

In conjunction with the circuits, signals, and methods described above with respect to FIGS. 1-11, a circuit includes an AC-coupling and level-shift circuit coupled between input terminals configured to receive a signal and another circuit, such as an amplifier. The AC-coupling circuit includes a plurality of capacitors, each capacitor including a first switch between a first capacitor terminal and one of the input terminals and including a second switch between a second capacitor terminal and a bias terminal. During a pre-charge phase, the switches are controlled to apply a common mode input voltage to the first capacitor terminals and a selected bias voltage to the second capacitor terminals. The pre-charge applied to the capacitors operates to level-shift an input signal, and an auto-zero operation or a chop operation may be used to reduce or eliminate the offset and noise. In an embodiment, the AC-coupling and level-shift circuit is coupled between input terminals and an amplifier circuit that uses a transconductance amplifier in the forward signal path and matching transconductance amplifier in the feedback signal path.

It is to be understood that, even though characteristics and advantages of the various embodiments have been set forth above, together with details of the structure and function of various embodiments, changes may be made in details, especially in the matters of structure and arrangement of parts within principles of the present disclosure to the full extent indicated by the broad meaning of the terms in which the appended claims are expressed. In some embodiments, the particular components or elements may vary depending on the particular implementation of the amplifier while maintaining substantially the same functionality, without departing from the scope and spirit of the disclosure.

What is claimed is:

1. A method of operating an amplifier circuit having a pre-charge phase and a sample/conversion phase, the method comprising:
    during a pre-charge phase:
        charging a first capacitor to a first bias voltage, the first capacitor coupled to a first input of an amplifier circuit having a second input and an output;
        charging a second capacitor to a second bias voltage, the second capacitor coupled to the second input; and
    during a sample/conversion phase:
        coupling the first input of the amplifier circuit to an input signal through the first capacitor to level-shift the input signal according to the first bias voltage; and
        coupling the output of the amplifier to the second input through the second capacitor to level shift a feedback signal according to the second bias voltage.

2. The method of claim 1, wherein, during an auto-zero phase, the method further comprises providing the first and second bias voltages to the first and second inputs of the amplifier and measuring an output signal to determine an auto-zero feedback voltage.

3. The method of claim 2, further comprising providing the input signal and the auto-zero feedback voltage to the second input of the amplifier circuit during the sample/conversion phase.

4. The method of claim 1, wherein:
    the first capacitor is configured to be coupled in series between an input and the first input of the amplifier circuit; and
    charging the first capacitor includes coupling the first capacitor to first and second voltages to provide the first bias voltage.

5. The method of claim 4, wherein:
    the second capacitor is configured to be coupled in series between the output of the amplifier circuit and the second input of the amplifier circuit; and
    charging the second capacitor includes coupling the second capacitor to a third voltage and the second voltage to provide the second bias voltage.

6. The method of claim 1, wherein charging the first and second capacitors comprises selectively controlling a charge pump to apply selected bias voltages to control terminals of a plurality of switches to couple the first capacitor to the first and second voltages and the second capacitor to the second and third voltages.

7. A circuit comprising:
    an amplifier circuit including a first input, a second input, and an output;
    a first capacitor configured to be coupled in series between a first input signal and the first input;

a first feedback capacitor configured to be coupled in series between the output and the second input;

a plurality of switches coupled to the first capacitor and to the first feedback capacitor;

a controller configured to control the plurality of switches to pre-charge the first capacitor and the first feedback capacitor to first and second bias voltages, respectively, during a pre-charge phase, the controller configured to control the plurality of switches to couple the first input signal to the first input of the amplifier circuit and to couple the output to the second input through the first feedback capacitor during a sample phase.

8. The circuit of claim 7, wherein the controller is configured to control the plurality of switches to provide the first and second bias voltages to the first and second inputs of the amplifier during an auto-zero phase.

9. The circuit of claim 7, wherein the amplifier further includes a second output, the circuit further comprising:

a second capacitor configured to be coupled in series between a second input signal and the second input of the amplifier; and a second feedback capacitor configured to be coupled in series between the second output and the first input;

wherein the plurality of switches are coupled to the second capacitor and the second feedback capacitor.

10. The circuit of claim 9, wherein, during the pre-charge phase, the controller is configured to control the plurality of switches to pre-charge the second capacitor and the second feedback capacitor to first and second bias voltage, respectively.

11. The circuit of claim 9, wherein, during the sample phase, the controller is configured to control the plurality of switches to couple the second input signal to the second input and to couple the second output to the first input.

12. The circuit of claim 9, wherein, during an auto-zero phase, the controller is configured to control the plurality of switches to provide the first and second bias voltages to the first and second inputs of the amplifier circuit and to sample output signals on the first and second outputs.

13. The circuit of claim 9, wherein the controller is further configured to control the plurality of switches to perform a chop operation.

14. The circuit of claim 7, further comprising a charge pump responsive to the controller to selectively bias the plurality of switches.

15. A circuit comprising:

an amplifier circuit including having a first input, a second input, a first output, a second output, a first feedback input and a second feedback input;

a first capacitor coupled to the first input;

a second capacitor coupled to the second input;

a first feedback capacitor coupled to the first feedback input;

a second feedback capacitor coupled to the second feedback input; and a plurality of switches coupled to the first and second capacitors and to the first and second feedback capacitors; and a control circuit coupled to the plurality of switches and configured to control the plurality of switches to pre-charge the first and second capacitors to a first bias voltage and the first and second feedback capacitors to a second bias voltage during a pre-charge phase, the control circuit to control the plurality of switches to couple first and second input signals to the first and second inputs and first and second feedback signals to the first and second feedback inputs, respectively, during a sample phase.

16. The circuit of claim 15, wherein the control circuit comprises:

a controller; and a charge pump responsive to the controller to selectively apply bias voltages to the plurality of switches.

17. The circuit of claim 15, wherein the control circuit controls the plurality of switches to provide the first and second bias voltages to the first and second inputs during an auto-zero phase.

18. The circuit of claim 17, wherein the auto-zero phase measures an offset error, which offset error is fed back during the sample phase through the first and second feedback capacitors to reduce the offset error in an output signal.

19. The circuit of claim 15, wherein, during the sample phase:

the first and second capacitors are configured to level-shift the first and second input signals based on the first bias voltage; and the first and second feedback capacitors are configured to level-shift the first and second feedback signals based on the second bias voltage.

20. The circuit of claim 15, wherein the control circuit controls the plurality of switches to perform a chop operation to reduce noise from the pre-charge phase and to reduce an offset error in an output signal.

* * * * *